United States Patent
Wilkinson et al.

(10) Patent No.: US 9,752,874 B1
(45) Date of Patent: *Sep. 5, 2017

(54) INTERNAL MEASUREMENT COLLECTION SYSTEM AND METHOD OF USING SAME

(71) Applicant: Amazon Technologies, Inc., Seattle, WA (US)

(72) Inventors: Matthew Tyler Wilkinson, Pittsburgh, PA (US); Grant B. Fresen, Pittsburgh, PA (US); Nicholas B. End, Pittsburgh, PA (US); Michael Lin, Pittsburgh, PA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/360,665

(22) Filed: Nov. 23, 2016

Related U.S. Application Data

(63) Continuation of application No. 13/492,221, filed on Jun. 8, 2012, now Pat. No. 9,514,487.

(60) Provisional application No. 61/494,493, filed on Jun. 8, 2011.

(51) Int. Cl.
*A43D 1/06* (2006.01)
*G01B 21/20* (2006.01)
*A41H 1/00* (2006.01)
*G06F 17/50* (2006.01)

(52) U.S. Cl.
CPC ............ *G01B 21/20* (2013.01); *A41H 1/00* (2013.01); *A43D 1/06* (2013.01); *G06F 17/50* (2013.01)

(58) Field of Classification Search
CPC ... A41H 1/00; A43D 1/02; A43D 1/08; A61B 5/103; A61B 5/107; G01B 21/20
See application file for complete search history.

(56) References Cited

U.S. PATENT DOCUMENTS

| | | | |
|---|---|---|---|
| 5,669,150 A | 9/1997 | Guertin et al. | |
| 6,192,593 B1 * | 2/2001 | Borchers | A43D 1/02 |
| | | | 324/716 |
| 6,741,728 B1 | 5/2004 | Genest | |
| 7,343,691 B2 * | 3/2008 | Long | A43D 1/06 |
| | | | 33/3 R |
| 7,805,851 B2 | 10/2010 | Pettersson | |
| 8,751,320 B1 | 6/2014 | Kemist | |
| 8,763,261 B1 * | 7/2014 | Kemist | G06Q 30/06 |
| | | | 33/3 R |

(Continued)

OTHER PUBLICATIONS

PCT Search Report and Written Opinion for Application No. PCT/US2012/041657, mailed on Jan. 7, 2013.
Krakow, "None-Slip", 18 Cycling Shoes in the RoadBIKE Test, Fascination Racing Cycle—RoadBIKE, Apr. 2009, pp. 73-78.
Office Action for U.S. Appl. No. 13/492,462 mailed on Dec. 24, 2014, Wilkinson et al., "Method and System for Recommending a Default Size of a Wearable Item Based on Internal Dimensions", 19 pages.

(Continued)

*Primary Examiner* — John Breene
*Assistant Examiner* — Eyob Hagos
(74) *Attorney, Agent, or Firm* — Lee & Hayes, PLLC

(57) ABSTRACT

A system for measuring dimensions and/or other internal properties of a shoe, garment or other object of interest is described. The system includes a fixture having a measurement tip. When the tip is placed inside of the object of interest, a processor collects positional data from the fixture to develop a three-dimensional model of the interior of the object. If the measurement tip includes one or more pressure sensors, the processor may collect pressure data and use the pressure data to include stretch properties in the three-dimensional model.

20 Claims, 9 Drawing Sheets

(56) References Cited

U.S. PATENT DOCUMENTS

| | | | |
|---|---|---|---|
| 2004/0000255 A1 | 1/2004 | Hernandez | |
| 2004/0187332 A1* | 9/2004 | Kikuchi | G01B 21/04 33/503 |
| 2005/0151963 A1* | 7/2005 | Pulla | G01B 21/04 356/139.03 |
| 2007/0011173 A1 | 1/2007 | Agostino | |
| 2009/0241360 A1 | 10/2009 | Tait et al. | |
| 2010/0238271 A1* | 9/2010 | Pfeiffer | A43D 1/06 348/46 |
| 2010/0293076 A1 | 11/2010 | End et al. | |
| 2011/0178762 A1* | 7/2011 | York | G01B 5/012 702/150 |
| 2011/0214501 A1 | 9/2011 | Ross et al. | |
| 2011/0277250 A1* | 11/2011 | Langvin | A43B 3/0084 12/133 R |
| 2012/0035509 A1 | 2/2012 | Wilson et al. | |
| 2012/0316827 A1 | 12/2012 | Wilkinson et al. | |
| 2012/0316985 A1 | 12/2012 | Wilkinson et al. | |
| 2016/0196602 A1 | 7/2016 | Wilkinson et al. | |

OTHER PUBLICATIONS

Office action for U.S. Appl. No. 13/492,221, mailed on Mar. 28, 2016, Wilkinson et al., "Internal Mesurement Collection System and Method of Using Same", 18 pages.

Office action for U.S. Appl. No. 13/492,462, mailed on Apr. 27, 2015, Wilkinson et al., "Method and System for Recommending a Default Size of a Wearable Item Based on Internal Dimensions", 15 pages.

Office action for U.S. Appl. No. 13/492,462 mailed on Aug. 18, 2015, Wilkinson et al., "Method and System for Recommending a Default Size of a Wearable Item Based on Internal Dimensions", 19 pages.

Office action for U.S. Appl. No. 15/070,077, mailed on Aug. 25, 2016, Wilkinson et al., "Determining a Size of an Item Based on Comparisons of Dimensional and Stretch Data", 24 pages.

Office action for U.S. Appl. No. 13/492,221 mailed on Sep. 14, 2015, Wilkinson et al., "Internal Mesurement Collection System and Method of Using Same", 20 pages.

\* cited by examiner

INTERNAL MEASUREMENT COLLECTION SYSTEM AND METHOD OF USING SAME

CROSS REFERENCE TO RELATED APPLICATION

This patent application claims the benefit of copending U.S. patent application Ser. No. 13/492,221, filed Jun. 8, 2012, entitled "INTERNAL MEASUREMENT COLLECTION SYSTEM AND METHOD OF USING SAME", which claims priority to U.S. Provisional Patent Application Ser. No. 61/494,493, filed Jun. 8, 2011, entitled "INTERNAL MEASUREMENT COLLECTION SYSTEM AND METHOD OF USING SAME," which is hereby incorporated in its entirety by reference.

BACKGROUND

The present disclosure relates to a novel device and system for acquiring internal dimensions of footwear, apparel, and other items.

Finding the correct footwear or apparel size to purchase from a remote location such as through a web-based storefront, or in a store at an ordering kiosk, is difficult due to the inability to try on footwear or apparel, which subsequently leads to a high number of returns. Many choose not to shop for these items online because they cannot physically try on the footwear, apparel, or accessory and do not want the inconvenience of returning improper fitting items. Furthermore, those who do shop online typically purchase the same footwear, apparel, or accessory model and size to which they are familiar, thus limiting their selection potential.

Finding an ideal fit online is also problematic because of the lack of uniformity and consistency of sizing among manufacturers. For example, a size 10 in footwear from one manufacturer typically has different internal dimensions from a size 10 from another manufacturer. Even footwear from the same manufacturer may have sizes that differ between models in terms of their internal dimensions. Manufacturers constantly change and discontinue models, so there is typically a need for a user to assess a shoe's fit, even if the user previously found a good fit in a given shoe model.

When purchasing a shoe or other wearable item online, the purchaser must select which size to get. This results in confusion and indecision when it comes to size and model selection on footwear and apparel items.

This document describes a device and system that may solve at least some of the issues described above, and/or other problems.

SUMMARY

In an embodiment, a system for determining internal dimensions of an object of interest includes an adjustable fixture. The fixture includes a measurement tip having a shape corresponding to an interior of an object of interest and a plurality of faces, a lateral member configured to laterally move the measurement tip within the object of interest, and a positional sensor configured to collect positional data of the fixture. A processor communicates with the positional sensor and receives the positional data from the positional sensor. A first database holds data representing three-dimensional fixture models, such that each fixture model includes dimensional data for a respective fixture. A second database holds data representing three-dimensional object models, such that each object model includes dimensional data for a respective object.

The measurement tip may include pressure sensors. For example the tip may include multiple faces, at least some of which include sensors mounted at a surface. If so, the processor may communicate with the pressure sensors and receive pressure data from the pressure sensors. Each object model may thus include pressure data for its respective object. Also, based on the pressure data and a location of an end of the lateral member, the processor may determine a set of offset positions, wherein each offset position is a separated from the end by a vector. It may then use the offset positions to develop a three-dimensional model of the object.

To develop a three-dimensional object model of an object, the system may retrieve a device identifier for the adjustable fixture, identify the three-dimensional fixture model in the first database that corresponds to the adjustable fixture; receive pressure data for the object of interest from the pressure sensors, receive positional data for the adjustable fixture from the positional sensor, determine a change in dimension of the adjustable fixture based on the positional data and the dimensional data from the adjustable fixture's corresponding three-dimensional fixture model, and use the change in dimension and pressure data to develop a three-dimensional model of the object of interest, wherein the developed three-dimensional model includes interior dimensions and material stretch properties for the object of interest.

In some embodiments, the measurement tip may include multiple movable sections configured to move from a retracted state to an expanded state. The fixture also may include a drive mechanism operably connected to the moveable sections and configured to facilitate movement of the movable sections from the retracted state to the expanded state. The fixture also may include a force gauge configured to measure an amount of force exerted by the movable sections on the object of interest. The movable sections also may include at least one associated reference point indicating a current position of the associated movable section. The moveable sections may include several sections that together are positioned and configured to conform to a shape of an interior of a toe portion and/or a heel portion of a footwear item.

In some embodiments, the adjustable fixture also may include a directional member that is connected to the lateral member via a first hinge, a base arm that is rotatably connected to the directional member via a second hinge, and a base that is rotatably connected to the base arm. The measurement tip may include pressure sensors. The processor may be in communication with the pressure sensors and configured to receive pressure data from the pressure sensors. Each object model may also include pressure data for its respective object.

In some embodiments, the system may receive pressure data from the pressure sensors for the object of interest, receive positional data for the adjustable fixture, and determine a lateral dimension of the object of interest based on the positional data, an angle measure for the first hinge, and an angle measure for the second hinge.

In other embodiments, a method of measuring properties of a wearable item include using a fixture to gather positional data and pressure data of an interior of an object. The fixture includes a measurement tip having a multiple faces, wherein each face includes pressure sensors that gather the pressure data, a lateral member configured to laterally move the measurement tip within a object of interest, and a positional sensor configured to collect the positional data. A processor receives: (i) pressure data from the pressure sensors for the wearable item; and (ii) positional data for the fixture from the positional sensor. Based on the pressure data and the positional data, the system develops a three-dimensional model of the wearable item.

DETAILED DESCRIPTION

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this document is to be construed as an admission that the embodiments described in this document are not entitled to antedate such disclosure by virtue of prior invention. As used in this document, the term "comprising" means "including, but not limited to."

Figure 1:
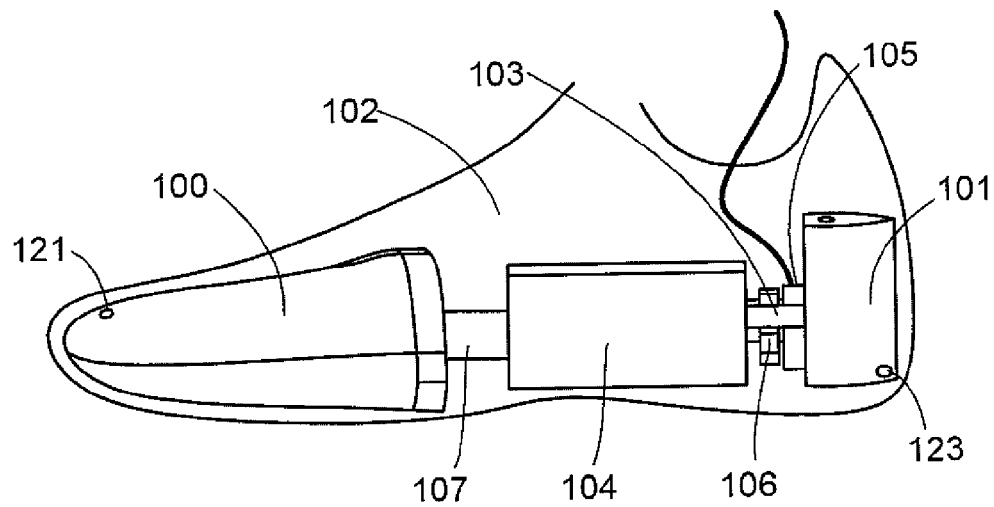
FIG. 1 illustrates a first embodiment of an internal measurement device placed within a shoe.

FIG. 1 shows an embodiment of an adjustable internal measurement device inserted into a shoe 102. In this example, the internal measurement device includes a front or toe portion 100 connected via one or more elements to a rear or heel portion 101. The device further includes a guide bar 103 connecting the heel portion 101 to a base 104, a connector 107 connecting the toe portion 100 to the base 104, a force gauge 105 configured to provide force feedback on stretch and material deformation when the adjustable fixture is expanded, and a rotating knob 106 positioned about the guide bar 103 and configured to cause the adjustable fixture to expand or retract when rotated. In the embodiment illustrated in FIG. 1, the device has the form of a shoe tree, although other adjustable structures may be used for the device. Adjustable fixtures may be configured to fit within other objects of interest, such as garments, other footwear or other wearable items. For example, a mannequin structure may be used for determining the internal dimensions of various apparel items such as a shirt, pants or a dress. See FIGS. 5-7 and the related description below for alternative devices.

Figure 2:
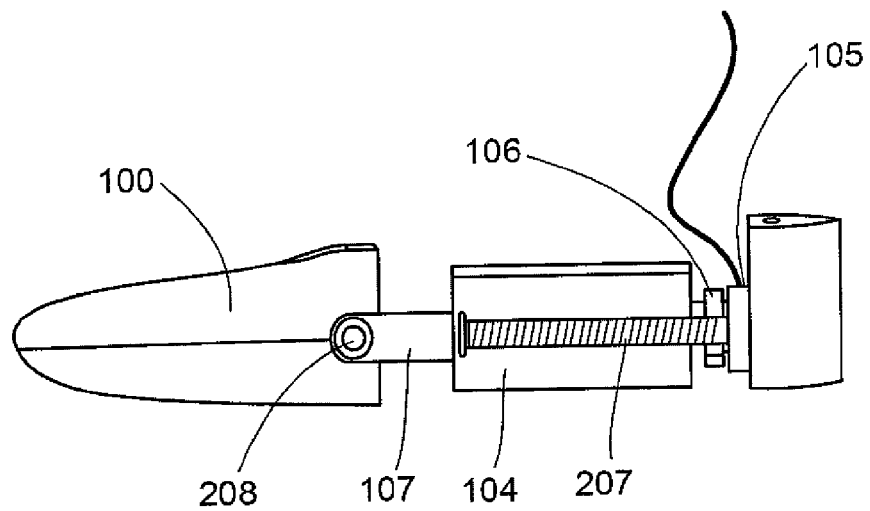
FIG. 2 is a cross-sectional view of a measurement device.

FIG. 2 illustrates a cross-section of the measurement device with a drive shaft 207 housed inside base 104 and connected to rotating knob 106. The drive shaft 207 expands or retracts the device when the rotating knob is turned to meet the required length of the particular shoe. The connector 107 may be a spring or manually be adjusted to a specific length and may include a joint 208 allowing flexibility of the toe portion 100.

Figure 3:
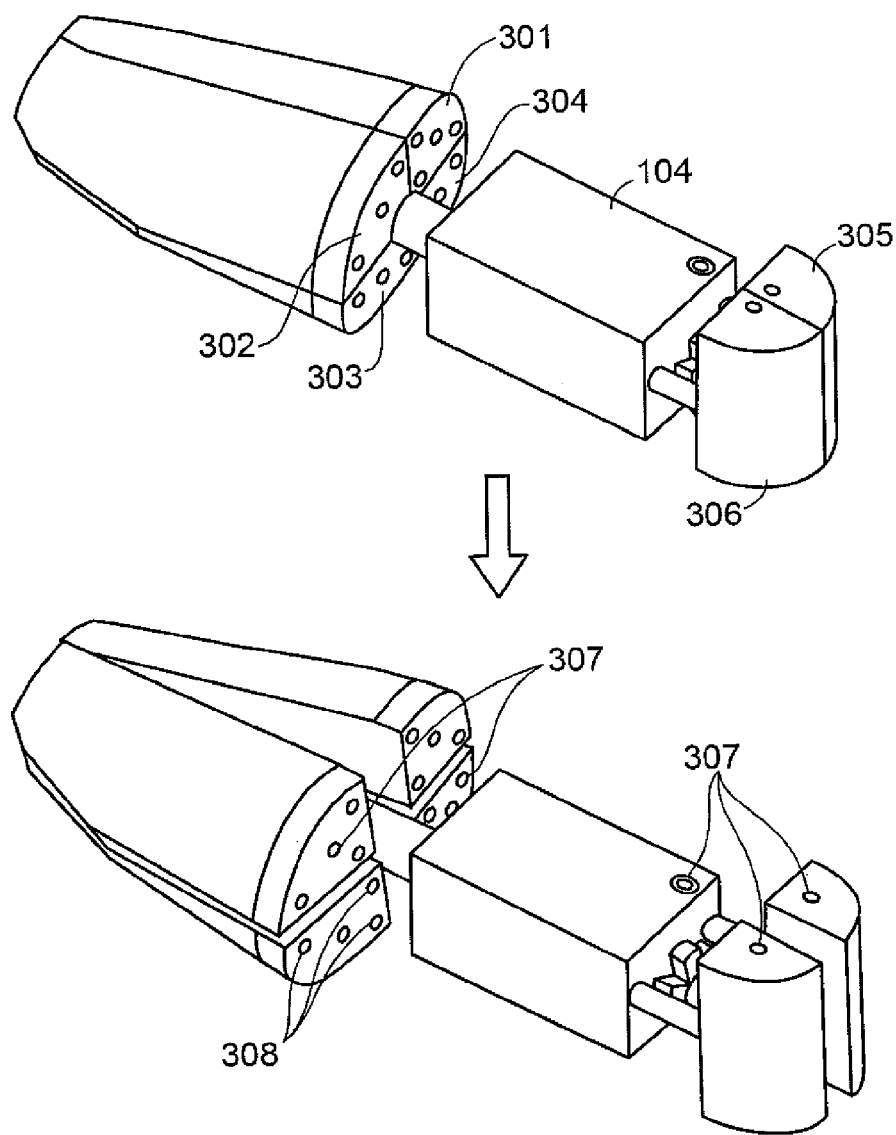
FIG. 3 illustrates an expansion of the measurement device of FIG. 2.

As shown in FIG. 3, the toe portion 100 of the device may be divided into multiple sections. For purposes of illustration, the toe portion 100 as shown in FIG. 3 includes four sections 301, 302, 303, and 304 that are configured to expand in width, height, and girth. The heel portion 101 may also be divided into multiple sections. For purposes of illustration, the heel portion 101 as shown in FIG. 3 includes two sections 305 and 306 configured to expand to a width of the heel when inserted into a shoe. It should be noted the device may have more or fewer sections at the toe portion 100 and heel portion 101.

Optionally, each of sections 301, 302, 303, 304, 305 and 306 may have a fiducial marker or other type of reference point 307 attached or otherwise integrated therein. These reference points 307 may also be located on the base 104. The location of each of the reference points 307 may be determined before and after expanding the adjustable fixture to determine the amount of expansion of the adjustable fixture. There may be additional secondary orientation points 308 on each section as well to determine the angular position of each section. Alternatively, the system may measure expansion of the fixture simply by measuring linear displacement of various sections, for example how far toe portion 100 moves away from heel portion 101, how far the heel portion sections 305, 306 move away from each other, how far any toe portion pair (e.g., 301/302 or 301/304) moves apart, etc.

Data related to the position of each of the reference points 307 and the secondary orientation points 308 may be collected both when the device is in a retracted state as well as when the adjustable fixture is in its expanded state. As the positions of the reference point 307 and secondary orientation points 308 are known prior to expanding the device, by measuring the change in position of the points, a three-dimensional (3D) modeling or similar imaging system may determine a 3D model of the internal dimensions of the shoe. Alternatively, other methods of determining expansion may be used, such as a measure of a number of turns of a drive shaft 207 that causes one portion of the device to move away from another portion of the device. A 3D model may be a digital image or representation of the internal dimensions of an object or an object being measured, in this example a shoe or the device used to measure the shoe. The 3D model may include data relating to width, height, depth, circumference, girth, and other related measurements at numerous locations about the item being measured.

For example, the system may start with a 3D model of the measuring device in a retracted position, and create a 3D model of the interior of the shoe based on the 3D data taken from the device when it is expanded in the shoe. For example, if a shoe is being measured, various internal dimensions such as toe-box width, toe-box height, girth, internal length and other related dimensions may be accurately determined by the position of the expanded shoe tree and used to create a 3D model of the shoe. The internal dimensions may be used in a software application similar to that as disclosed in co-pending U.S. patent application Ser. No. 12/800,549 to recommend to a user a shoe or other apparel item having similar internal dimensions to one the user owns or has previously worn. The disclosure of U.S. patent application Ser. No. 12/800,549 is hereby incorporated by reference in its entirety.

Returning to FIG. 1, the force or pressure gauge 105 may be configured to provide feedback such that an operator of the adjustable fixture can make sure the amount of expansion of the adjustable fixture is consistent between shoes. A particular force may be applied to the adjustable fixture in order to capture the deformation and stretch of the shoe under similar weight bearing loads that a shoe experiences when being put on an individual's foot. A calculation to determine an amount of stretch and deformation for a shoe may be performed based upon the amount of expansion of the shoe fixture under a given force or forces. For example, each shoe measured may be subjected to a range of forces from 10 pounds per square inch (psi) to 100 psi. At each 10 psi increment (i.e., 10 psi, 20 psi, 30 psi, . . . ), the amount of stretch and deformation may be measured and recorded in the database along with the internal measurements of the shoe. Force feedback also may be collected from one or more pressure sensors 121, 123 located at the surface of the toe and/or heel portion.

Expansion of the adjustable fixture, and the resulting application of force, may be performed manually through a mechanical mechanism used to increase the force applied (e.g., through a ratcheting device, a screw device configured to increase the adjustable fixture in length and width thereby applying additional force, or a device such as that described below with respect to FIGS. 6 and 7). Alternatively, the expansion may be performed automatically via a robotic process (e.g., a small electric motor configured to drive an expanding worm or screw drive configured to increase the adjustable fixture in length and width) or via a hydraulic process (e.g., a pressurized liquid or gas may be pumped into the adjustable fixture, thereby causing expansion of the adjustable fixture).

Various related values may be determined based upon the amount of stretch and deformation as well. For example, a support value may be determined based upon the amount of stretch. A shoe with a low value of stretch may be more likely to provide a high level of support. Similarly, a comfort level may be determined and stored based upon the amount of stretch and deformation. A shoe having a high level of stretch and deformation may result in a low comfort rating as the shoe may be likely to rub the wearer's foot in various areas due to the stretch and deformation.

Figure 4:
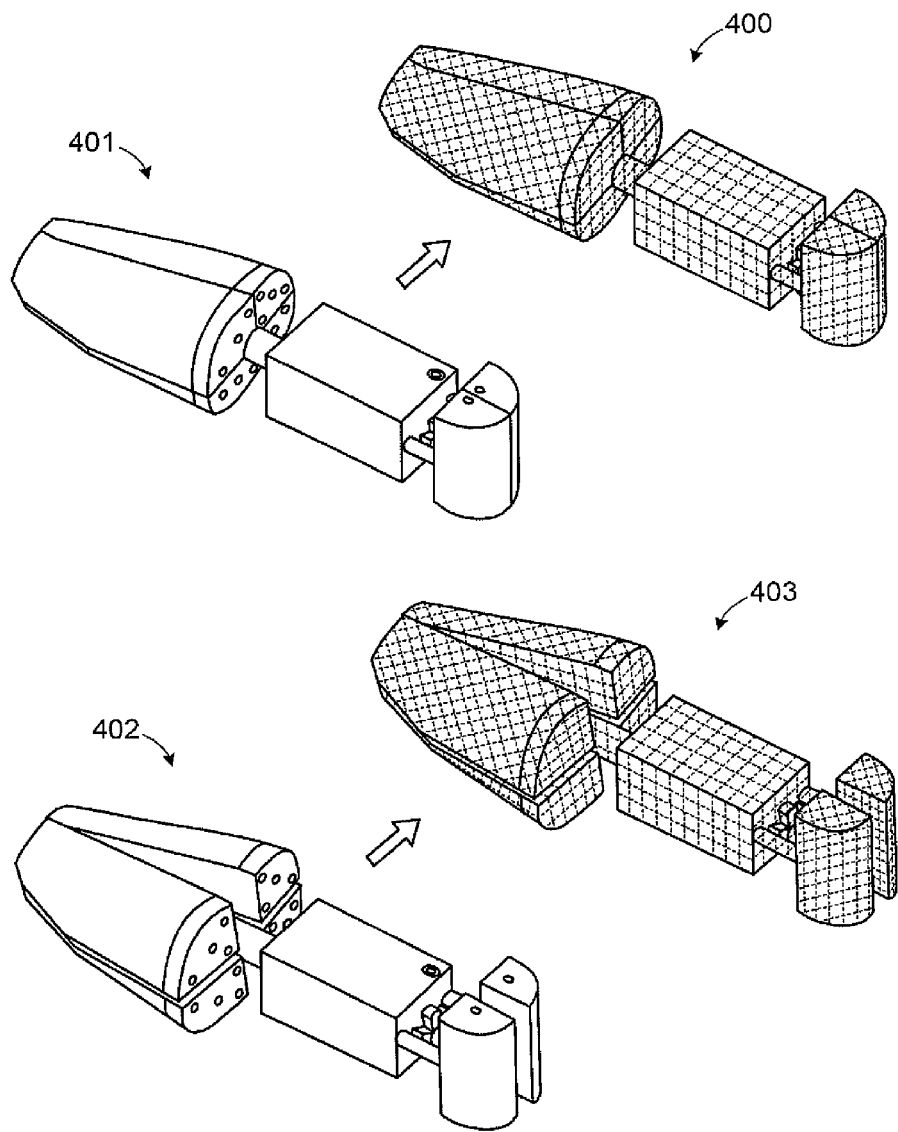
FIG. 4 illustrates several configurations of the measurement device and resulting three-dimensional images.

FIG. 4 illustrates various 3D models of a measurement device when compressed and expanded. The database described above may include a 3D digital model 400 of the measurement device 401 when in its normal or compressed state. The operator inserts the measurement device into a shoe and the measurement device expands to the volume of the shoe either automatically or with manual input from the operator. After the shoe fixture has expanded to the volume of the shoe, such as shown in measurement device 402, the device or another device collects measurements at the various sections of the shoe tree using any measurement system including, but not limited to, 3D imaging, magnetic resonance imaging (MRI), electromagnetic field tracking or other non-contact imaging, 3D point location, global positioning, a ruler, or a caliper. Optionally, the imaging may utilize the reference markers 307 and 308 as discussed above. These measurements may capture the orientation and positioning of the sections 301, 302, 303, 304, 305 and 306 of the measurement device in reference to each other and may be directly input into the system or can be entered manually into the system. Once the relative measurements and positioning of the device sections are received, the computer application may manipulate the 3D data of the digital shoe fixture model to produce a 3D model 403 of the shoe corresponding to the size of the expanded device 402. By adjusting the 3D digital adjustable fixture model to the orientation of the physical adjustable fixture when inserted in the shoe, precise measurements of that shoe can be extracted including various lengths, widths, girths, and heights.

The measurement system may include various adjustable shapes and sizes. Each measurement device may have one or more associated 3D digital models in the database. The physical device and its associated 3D digital model(s) may be associated through an identification system that links the physical device to its respective 3D digital model(s). For example, when initializing the measurement system, an operator may electronically connect a measurement device (e.g., the adjustable fixture for measuring shoes as shown in FIG. 1) to the measurement system. The device may connect via a wired connection (e.g., a communication wire having a USB plug for connecting to a computer running the measurement system) or a wireless connection (e.g., using a personal area network connection such as Bluetooth). Once the measurement device is connected, the operator may enter an identification code related to the measurement device such that the measurement system may identify a 3D model that matches the code, and load the appropriate 3D digital model for the adjustable fixture from the database. Alternatively, the device may transmit identification information automatically to the measurement system when connected.

Methods similar to those described for shoes are also applicable to apparel and accessories as well. The internal measurements of jeans, pants, shirts, bras, hats and headwear, handbags, and other apparel and accessories may be obtained by using an measurement device that is placed within the shirt, pant, bra, hat, handbag, or other apparel. A 3D digital model of the device is taken when in its compressed or normal state prior to expansion. As discussed above, each adjustable fixture may have an associated 3D digital model stored in a database and loaded by the measurement system upon initialization. The measurement device may be expanded inside the apparel item or accessory to determine a 3D digital model of the internal dimensions of the apparel item or accessory from which internal measurements may be determined.

Figure 5:
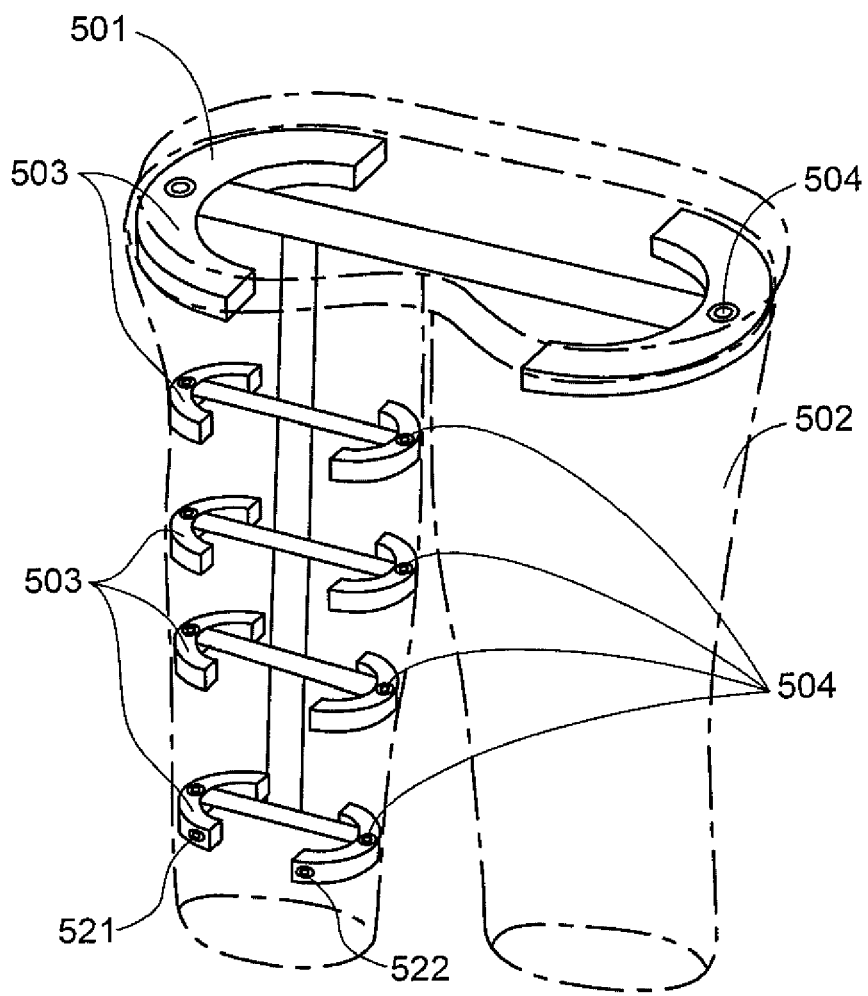
FIG. 5 illustrates an alternate embodiment of a measurement device for use with an apparel item.

The internal measurement device may include a mold or other similarly shaped device representing a part of the human body. As shown in FIG. 5, an embodiment of a measurement device 501 may be shaped as a lower portion of a human body including a waist area and two legs for determining the internal dimensions of pants 502. The adjustable fixture 501 is composed of various sections 503 that expand to the volume of the apparel and accessories obtaining measurements including but not limited to various length, height, girth, and width measurements. The positions of reference points 504 may be recorded and/or lateral expansion of the sections 503, may be measured when the measurement device 501 is inserted into the pants 502. The measurement system that may include, and is not limited to, 3D imaging technology, MRI and other non-contact imaging, global positioning technology, electromagnetic field tracking, a ruler, caliper, or robotic feedback system. Based on the measurements and positioning of these sections 503 relative to one another, the system may determine various measurements of the apparel and accessories including various lengths, heights, widths, and girths through manipulating the 3D digital model of the measurement device 501 to mimic the actual adjustable fixture in its expanded state. In addition, one or more pressure sensors 521, 522 may collect force feedback data that may be used to measure properties of the material such as stretch or expansion measurements. Such measurements may be used to ensure consistency of dimensional measurements among multiple garments and materials.

The manipulated 3D digital model may be stored in a database and associated with the apparel item being measured, in this example pants 502. From the digital model, specific internal dimensions may be calculated and stored as well. For example, the circumferences of the waist, bottom leg opening, calf area, knee area, thigh area as well as other measurements such as inseam, overall length and other related measurements may be determined and stored in the database as being related to pants 502.

Figure 6:
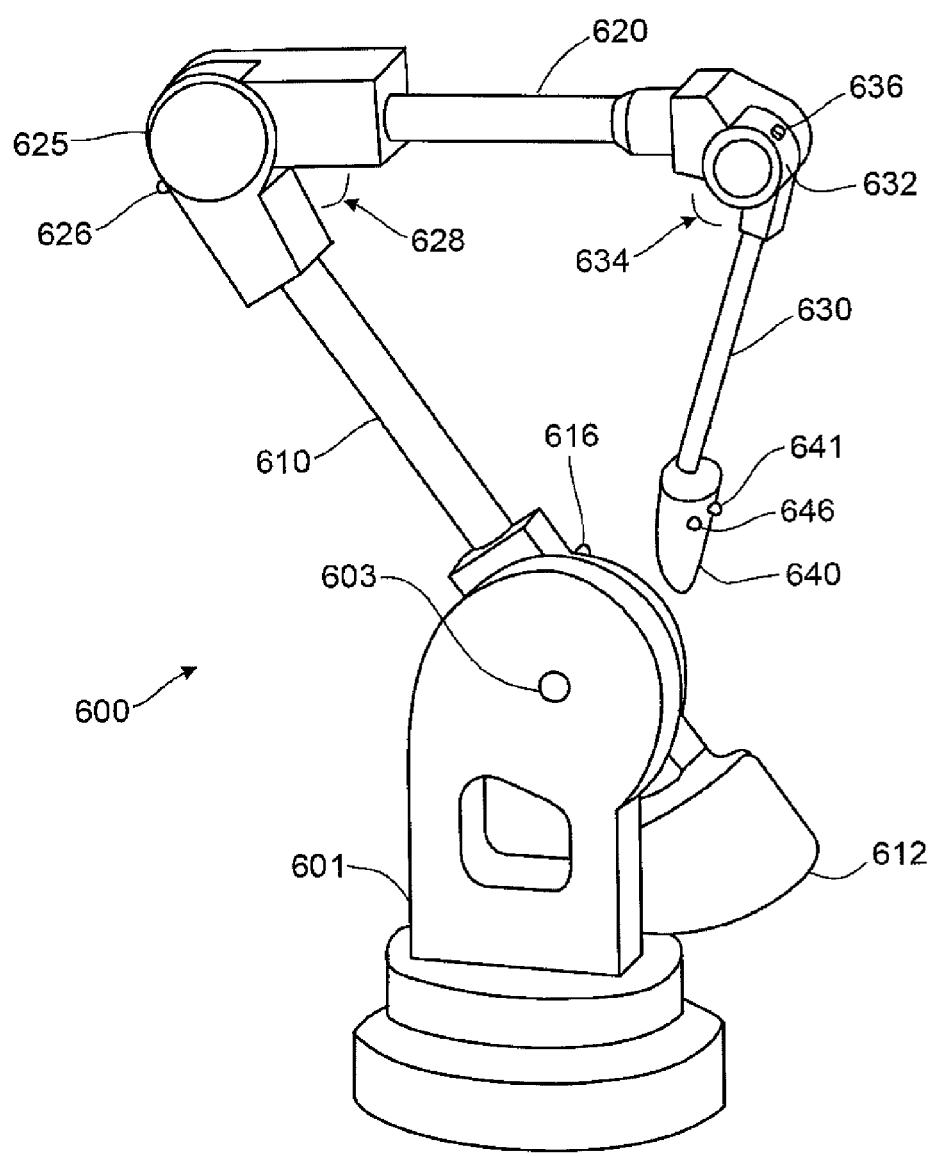
FIG. 6 illustrates an alternate embodiment of an internal measurement device.
Figure 7:
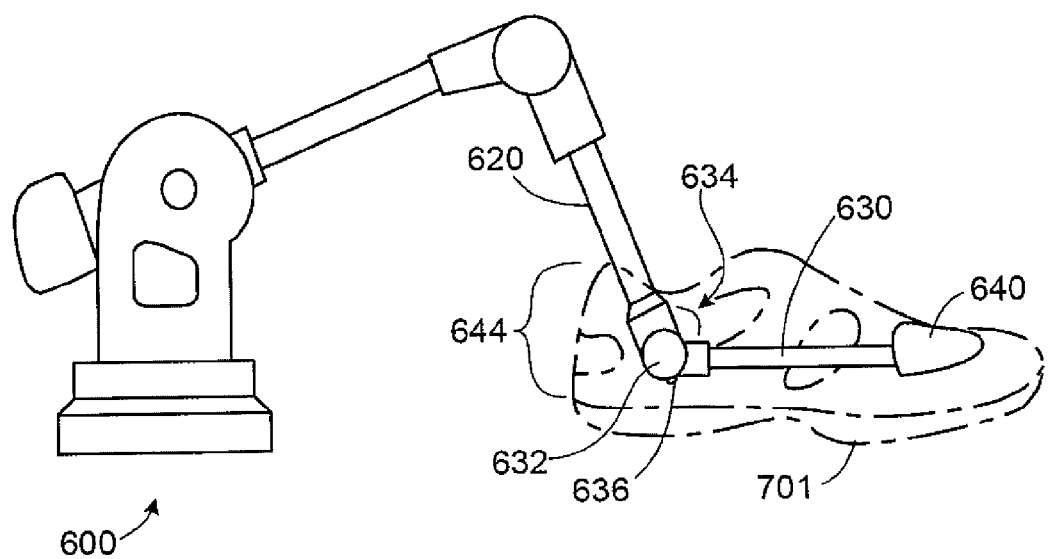
FIG. 7 illustrates the device of claim 6 as it may be used to capture internal measurements of a shoe.

FIG. 6 illustrates an alternate measuring device 600, in this embodiment a coordinate measuring machine (CMM) that include a base 601. The base 601 includes a fulcrum 603 such as an axle or hinge about which a base arm 610 pivots. One end portion of the base arm 610 may include a counterweight 612. The opposite end portion of the base arm 610 is pivotably connected to a first end of a directional arm 620 by a hinge 625, which may allow a limited axis of rotation. For example, the hinge 625 may limit the axis of rotation such that an inner angle 628 created by the base arm and the directional arm is no less than 45 degrees and no more than 180 degrees. Other restrictions are possible. The second end of the directional arm 620 may be pivotably connected by a hinge 632 to a placement member 630 to which a measuring tip 640 is secured. The hinge 632 also may limit an axis of rotation such that an angle 634 created by the directional arm and the placement member is no less than 75 degrees and no more than 270 degrees. Other restrictions are possible. Either or both hinges 625 and 632 may be equipped with a resistive element that so that force must be applied to the unit in order to change the angles 628, 634 in some or all positions. A positional sensor 636 within or near the hinge 634 may detect lateral movement of the placement member 630 and/or the angle of the hinge 634. Similarly, other positional sensors 616, 626 within or near the other hinges 603, 625 may detect the angles of those hinges.

As shown in FIG. 6, the measuring tip 640 has a shape that corresponds to a shape of an interior of the object that is to be measured. In this example, the measuring tip 640 has a tapered shape corresponding to the shape of the toe of a shoe tree. The measuring tip 640 may be equipped with one or more sensors 641, 646, such as pressure sensors, that may be used to capture data that is used to measure the interior of the object in which the tip is placed. For example, referring to FIG. 7, when the measurement tip 640 and placement member 630 are placed inside of a shoe 701, a human operator may place the measurement tip in a forward position so that the tip contacts the toe area of the shoe. Alternatively, the device 600 may include one or more motors that control the angles formed at the base 601 at the fulcrum 603, as well as the angles formed at the hinges 625, 632. The tip may be placed as far forward as it will reach without the application of a threshold degree of external force. The sensors will then record pressure data from multiple locations on the tip to determine dimensions and stretch qualities of the interior body of the toe of the shoe. For example, the device may collect pressure data F1 from a pressure sensor when the tip is initially placed in the shoe and the sensor contacts the inner wall of the shoe. A known additional amount of force may then be applied to move the tip forward into the toe, and a second pressure measurement F2 may be taken from the sensor. The stretch may be a function of the difference in pressure applied to the sensor (F2−F1) and optionally also a function of a measure of the displacement of the sensor.

The device also may measure lateral displacement to determine how far forward the tip 640 has been placed into the shoe, thus providing a measurement of length of the interior. Data such as an angle measure 634 between placement arm 630 and directional member 620 may be used to determine the amount of displacement. For example, the operator may be instructed to position the placement arm 630 in the shoe so that the directional member 620 contacts a top of the rear 644 of the shoe. A processor connected to the device may detect the angle measure 634 and a known or presumed height of the rear 644 of the shoe to determine a lateral measurement to add to that of the placement arm 630 and tip 640 to measure the interior length of the shoe. Other methods of measuring lateral displacement are possible, such as by instructing the user to rotate, or automatically rotating, the device within the shoe so that the tip moves to multiple areas and collects data from multiple interior sidewalls. If so, the device can collect angle data from the hinges to determine the various positions of the tip, use the force feedback to identify positions the tip's sensors encounter a sidewall, and build the 3D model based on those positions.

For example, the device may include, or it may be electronically connected to a processor that implements, programming instructions that calculate shoe measurements using one or more equations that will vary depending on the known lengths of the arm members 610, 620, 630 and the dimensions of tip 640. The device is calibrated so that when placed in a shoe, the positions of the components in an extended position (FIG. 7) may be determined relative to a home, or retracted, position (FIG. 6).

Figure 8:
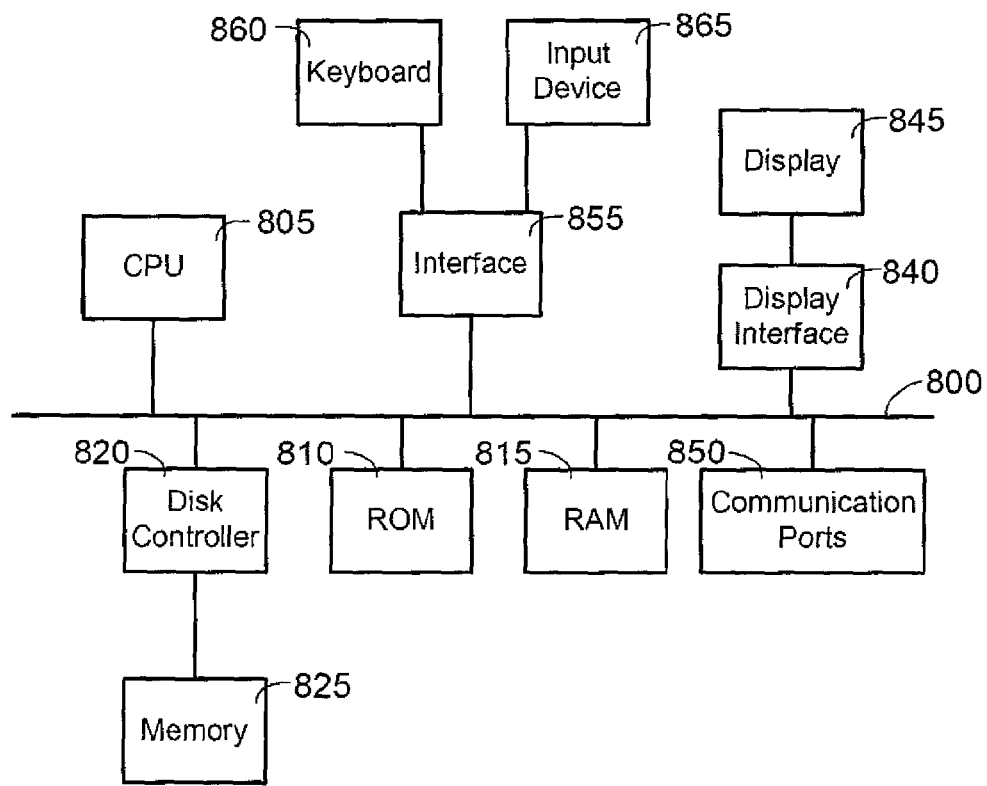
FIG. 8 illustrates elements of computer hardware that may be used with the devices of FIGS. 1-7.

FIG. 8 depicts a block diagram of internal hardware that may be used to contain collect and process data that is captured by the device described above. A bus 800 serves as the main information highway interconnecting the other illustrated components of the hardware. CPU 805 is a processor that performs calculations and logic operations required to execute a program. Read only memory (ROM) 810 and random access memory (RAM) 815 constitute examples of memory devices.

A controller 820 provides an interface between with one or more optional tangible, computer-readable memory devices 825 and the system bus 800. These memory devices 825 may include, for example, an external or internal DVD or CD ROM drive, a hard drive, flash memory, a USB drive or the like. These various drives and controllers are optional devices. Additionally, the memory devices 825 may be configured to include individual files for storing any software modules or instructions, auxiliary data, common files for storing groups of results or auxiliary, or one or more databases for storing the result information, auxiliary data, and related information as discussed above.

Program instructions, software or interactive modules for performing any of the methods and systems as discussed above may be stored in the ROM 810 and/or the RAM 815. Optionally, the program instructions may be stored on a tangible computer readable medium such as a compact disk, a digital disk, flash memory, a memory card, a USB drive, an optical disc storage medium, such as a Blu-Ray™ disc, and/or other recording medium.

An optional display interface 840 may permit information from the bus 800 to be displayed on the display 845 in audio, visual, graphic or alphanumeric format. The information may include information related to a current job ticket and associated tasks. Communication with external devices may occur using various communication ports 850. An exemplary communication port 850 may be attached to a communications network, such as the Internet or an local area network.

The hardware may also include an interface 855 which allows for receipt of data from input devices such as a keyboard 860 or other input device 865 such as a mouse, a joystick, a touch screen, a remote control, a pointing device, a video input device and/or an audio input device.

Figure 9:
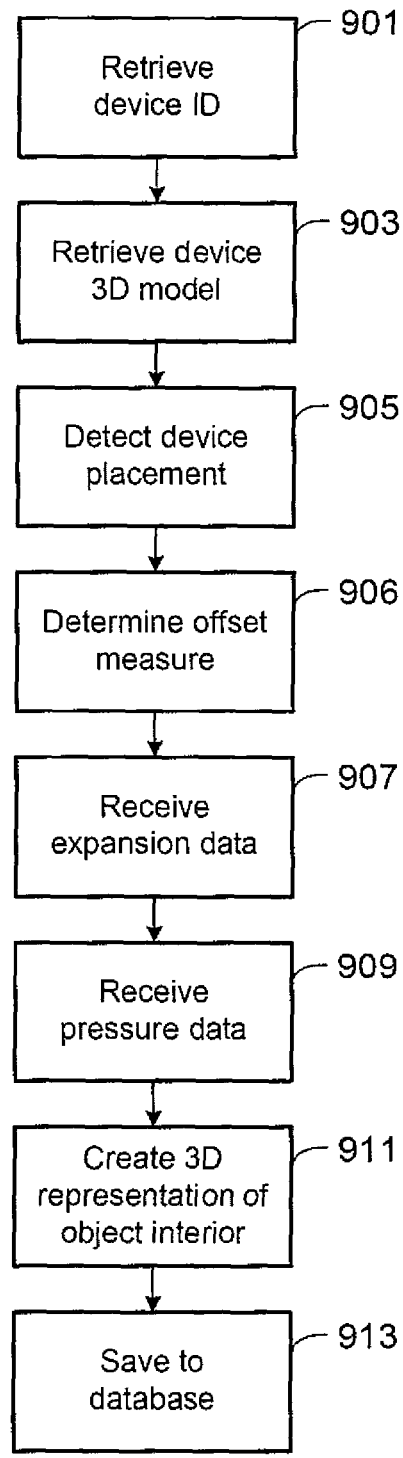
FIG. 9 is a flowchart showing elements of a data collection process.

FIG. 9 is a flow diagram showing steps that a measurement collection system such as either of the ones described above may follow to generate a 3D model of an interior of a shoe or other object. A processor may implement programming instructions to apply the process, starting with obtaining a device ID 901, such as a serial number or other identifier that uniquely identifies the measuring device. The system may access a modeling database to retrieve one or more known physical characteristics of the device 903, such as a 3D model including various x, y and z (length, width and height) coordinates of a portion of the device (such as the tip 640 of FIG. 6).

The system may detect that device has been placed into an object to be measured 905, such as by detecting force applied to a sensor of the device's tip, or by a human input indicating that the device has been placed. The system may then determine an offset measure 906 for the device, to measure a lateral displacement that will correspond to the a length of the interior being measured. For example, for the device of FIG. 2, the offset measure may be an amount that the toe portion 100 has extended away from the base 104. For the device of FIG. 7, the offset measure may be a displacement measurement such as that described above in the discussion of FIG. 7.

Returning to FIG. 9, if the measurement device is an expandable device such as that of FIG. 2, the system may receive expansion data 907, representing one or more measurements indicating how far one or more portions of the device have moved from a retracted position. For example, the toe portion of the device of FIG. 2 may expand when in a shoe, thus allowing the system to gather data as to the size and/or volume of the interior of the toe portion of the shoe. In addition, for any embodiment of the measurement device, the system may receive pressure data 909 from various sensors on the measurement device. The pressure data may include magnitude and directional elements. Magnitude elements may correspond to raw measurements of force applied to a sensor. Directional elements may be determined if the sensor is capable of collecting a directional component, or they may be determined from the 3D model of the measurement device based on a known position of the sensor. For example, it may be known that a sensor positioned on a top of the device will receive a downward pressure, while a sensor positioned on the bottom of the device will receive an upward pressure.

The processor will then use the dimensional and pressure data to create a 3D model of the interior of the object 911, and the model may be saved to a data storage facility 913 such as a searchable database. The dimensional data may be used to establish voxels or other 3D data points representing the volume and shape of the interior. The pressure data may be used to establish measurements of stretch at the edges of the interior, such as measurements that may be used to assess the given stretch of a textile in response to an applied force. For any given point on the volume, stretch may be measured as a vector difference between the x, y, and z values of the point at a location before the application of any force ($F_O$) and after the point moves in response to a predetermined amount of stretch force ($F_S$).

Figure 10:
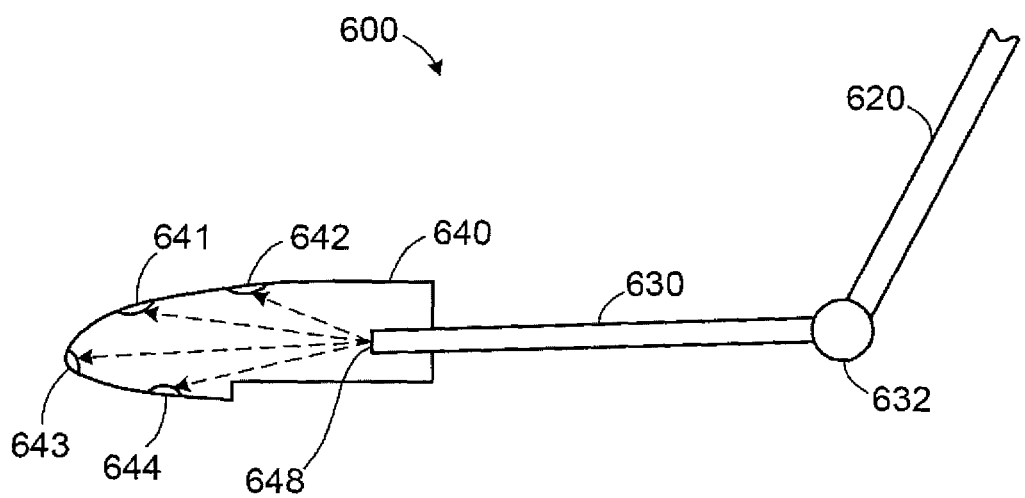
FIG. 10 illustrates how the devices of FIGS. 1-7 may use force feedback to determine internal properties of a shoe.

FIG. 10 helps to illustrate how the elements of an adjustable device may work together to gather data to build a 3D model of an object, continuing the example of a shoe. FIG. 10 shows that an adjustable device 600 may be placed in a shoe so that its placement arm 630 and directional member 620 form an angle at hinge 625. The directional member 620 will rest against the back of the shoe. The system may determine a position of an outer end 648 of the placement arm 630 using data corresponding to the lengths of the members and angles formed by the device. Various such methods are known and used in current CMM systems. The system may then determine three-dimensional offset measurements for multiple points on the surface of the measuring tip 640. The measurements may be determined by detecting force measurements from any or all of the pressure sensors 641-644 that are positioned at various points of the surface of measuring tip 640. The pressure sensors may be any suitable sensors that can detect various directional components of a force, such as six-axis force sensors. The force feedback can be used to determine what areas of the measuring tip are in contact with the inner walls of the shoe, so that the locations of material are known. If no force is detected, the system may presume that the inner wall of the shoe extends beyond the force sensor, and it may extrapolate a position above that force sensor based on the next nearest locations of detected force.

As an example, the system may determine a 3D interior wall location as a vector measurement of distance from outer end 648 of the placement arm to the position of any pressure sensor (e.g., 641) that detects force of at least a threshold amount, or within a threshold range $F1 \rightarrow F2$.

Thus, each object in the database may include volumetric pixels representing its interior volume, and some or all of the pixels may be characterized by quantitative and/or qualitative information such as size, shape and/or stretch characteristics of the textiles surrounding the interior. Quantitative parameters also may include, for example, toe tapering, calf girth or other girths, heel height or other heights, heel-to-toe drop, toe raise, arch support, stretch, sole thickness, strap thickness and/or location, and weight. Qualitative parameters may include, for example, color, material, shoe type, cushioning, activity, activity surface, activity duration, style, purchase history, and biomechanical measurements. The system also may save information that is associated with the user, such as body metrics (weight, height, body type), purpose of the footwear or apparel (e.g., running, walking, hiking), activity frequency and activity duration. Qualitative and personal data may act as filters to narrow similar shoe fitting recommendations.

The present system through which internal measurements of footwear, apparel, and accessories are acquired includes of an adjustable fixture and a 3D digital model of that adjustable fixture when in its collapsed or normal state prior to expansion. The adjustable fixture is composed of various sections that expand to the volume of the footwear, apparel, or accessory including but not limited to various lengths, heights, widths, and girths. When the adjustable fixture is inserted, measurement and reference points are recorded on each of these sections using a measurement system including, but not limited to, 3D imaging technology, MRI (Magnetic Resonance Imaging) and other non-contact imaging technologies, global positioning technology, a ruler, caliper, or robotic feedback system. Based on the measurements and positioning of these sections relative to one another computer software can determine various measurements of the footwear, apparel, or accessory including various widths, girths, heights, and lengths through manipulating the 3D digital model of the adjustable fixture to mimic the positioning and expansion of the actual adjustable fixture. In addition, the collected measurements may also include pressure or force feedback from the various sections of the adjustable fixture to account for the different stretch and other dynamic characteristics of the materials of the footwear, apparel, or accessory.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A system for determining internal dimensions of an object of interest, the system comprising:
    an adjustable fixture comprising:
        a plurality of sections, wherein an individual section has a shape corresponding to an interior portion of the object of interest;
        a member configured to expand a first pair of sections within the object of interest in a first direction to measure a first internal distance and to expand a second pair of sections in a second direction that is perpendicular to the first direction to measure a second internal distance;
        a positional sensor configured to collect positional data of the adjustable fixture based at least in part on expansion of the first pair of sections within the object of interest in the first direction and expansion of the second pair of sections within the object of interest in the second direction;
        a pressure sensor, located on outward facing surfaces of the first pair of sections and the second pair of sections, configured to collect pressure data based at least in part on the expansion of the first pair of sections within the object of interest in the first direction and the expansion of the second pair of sections within the object of interest in the second direction;
    a processor in communication with the positional sensor and the pressure sensor, and configured to receive the positional data from the positional sensor and the pressure data from the pressure sensor;
    a first database to store an object model associated with the object of interest, the object model including the positional data and the pressure data; and
    a memory containing instructions that, when executed, cause the processor to:
        retrieve a device identifier for the adjustable fixture;
        identify, using the device identifier, a three-dimensional fixture model from a plurality of three-dimensional fixture models stored in a second database, the three-dimensional fixture model corresponding to the adjustable fixture;
        determine a change in dimension of the adjustable fixture based on the positional data and the three-dimensional fixture model;
        determine material stretch properties of the object of interest based on the pressure data; and
        develop the object model using the change in dimension and the material stretch properties.

2. The system of claim 1, wherein the adjustable fixture further comprises a drive mechanism operably connected to the plurality of sections and configured to cause one or more the plurality of sections to move from a retracted state to an expanded state.

3. The system of claim 2, wherein a section of the plurality of sections comprises at least one reference point indicating a current position.

4. The system of claim 2, wherein the object of interest is a footwear item and at least one section of the plurality of sections is configured to conform to a shape of a toe portion of the footwear item.

5. The system of claim 1, wherein the adjustable fixture further comprises a force gauge configured to measure an amount of force exerted by the plurality of sections on the object of interest.

6. The system of claim 1, wherein the instructions further cause the processor to determine an offset position based at least in part on the expansion of the individual section within the object of interest.

7. The system of claim 6, wherein the instructions further cause the processor to use the offset position to develop three-dimensional data for the object model.

8. The system of claim 1, wherein:
    the adjustable fixture further comprises:
        a directional member that is connected to the member via a first hinge;
        a base arm that is rotatably connected to the directional member via a second hinge; and
        a base that is rotatably connected to the base arm.

9. The system of claim 1, wherein the instructions further cause the processor to determine a girth of the interior portion of the object of interest based on the positional data.

10. A system for measuring a wearable item, the system comprising:
    a fixture comprising:
        a plurality of measurement sections that correspond to an interior portion of the wearable item, the plurality of measurement sections comprising a plurality of pressure sensors, located on outward facing surfaces of the plurality of measurement sections, configured to collect pressure data;
        a member configured to move a first pair of measurement sections within the wearable item in a first direction to measure a first internal dimension of the interior portion of the wearable item and to move a second pair of measurement sections within the wearable item in a second direction that is perpendicular to the first direction to measure a second internal dimension of the interior portion of the wearable item; and
        a positional sensor configured to collect positional data of the fixture based at least in part on the member moving the first pair of measurement sections and the second pair of measurement sections;
    a processor in communication with the positional sensor and the plurality of pressure sensors, and configured to receive the positional data from the positional sensor and the pressure data from the plurality of pressure sensors; and
    a memory containing instructions that, when executed, cause the processor to:
        retrieve a device identifier for the fixture;
        identify, using the device identifier, a three-dimensional fixture model from a plurality of three-dimensional fixture models stored in a fixture database, the three-dimensional fixture model corresponding to the fixture;

determine a change in dimension of the fixture based on the positional data and the three-dimensional fixture model;

determine material stretch properties of the wearable item based on the pressure data; and develop an object model using the change in dimension and the material stretch properties.

11. The system of claim 10, wherein the instructions further cause the processor to:

determine a plurality of offset positions based at least in part on movement of the first pair of measurement sections within the wearable item in the first direction and movement of the second pair of measurement sections within the wearable item in the second direction; and use the plurality of offset positions to develop the object model for the wearable item.

12. The system of claim 11, wherein each offset position is separated from an end by a vector.

13. The system of claim 10, wherein:

an individual measurement section is configured to move from a retracted state to an expanded state;

the fixture further comprises a drive mechanism operably connected to the plurality of measurement sections and configured to facilitate movement of the individual measurement sections from the retracted state to the expanded state; and the fixture further comprises a force gauge configured to measure an amount of force exerted by the plurality of measurement sections on the wearable item.

14. The system of claim 13, wherein an individual measurement section of the plurality of the measurement sections comprises at least one associated reference point indicating a current position of the individual measurement section.

15. The system of claim 14, wherein:

the wearable item comprises a footwear item;

the interior portion of the wearable item comprise a toe portion of the footwear item;

the plurality of measurement sections comprise a measurement tip and together are positioned and configured to conform to the toe portion of the footwear item; and the system further comprises a second plurality of measurement sections that together are positioned and configured to conform to a shape of an interior of a heel portion of the footwear item.

16. The system of claim 10, wherein the fixture further comprises:

a directional member that is connected to the member via a first hinge;

a base arm that is rotatably connected to the directional member via a second hinge; and a base that is rotatably connected to the base arm.

17. The system of claim 10, wherein the instructions further cause the processor to determine a girth of the interior portion of the wearable item based on the positional data.

18. A method comprising:

using a fixture to gather positional data and pressure data of an interior of an object, the fixture comprising:

a plurality of measurement sections that correspond to an interior portion of the object;

a plurality of pressure sensors configured to collect the pressure data;

a member configured to move a first pair of measurement sections within the object in a first direction to measure a first dimension of the interior portion of the object and to move a second pair of measurement sections in a second direction that is perpendicular to the first direction to measure a second dimension of the interior portion of the object; and a positional sensor configured to collect the positional data based at least in part on the member moving the first pair of measurement sections and the second pair of measurement sections;

retrieving a device identifier for the fixture;

identifying, using the device identifier, a three-dimensional fixture model associated with the fixture;

determining a change in dimension of the fixture based upon the positional data and the three-dimensional fixture model;

determining material stretch properties of the object based on the pressure data; and creating a three-dimensional object model of the object based upon the change in dimension and the material stretch properties.

19. The method of claim 18, further comprising:

determining a plurality of offset positions based at least in part on movement of the first pair of measurements sections within the object in the first direction and movement of the second pair of measurement sections within the object in the second direction;

including the plurality of offset positions in the positional data;

receiving, by a processor and from the plurality of pressure sensors, the pressure data;

receiving, by the processor and from the positional sensor, the positional data; and developing the three-dimensional object model using the pressure data and the positional data.

20. The method of claim 18, wherein the object comprises a shoe and the material stretch properties comprise at least one of a value related to an amount of support the shoe provides or a value related to an amount of comfort the shoe provides.

* * * * *